(12) United States Patent
Song et al.

(10) Patent No.: US 12,364,114 B2
(45) Date of Patent: Jul. 15, 2025

(54) DISPLAY DEVICE

(71) Applicant: Samsung Display Co., Ltd., Yongin-si (KR)

(72) Inventors: Hyun-Gue Song, Hwaseong-si (KR); Nari Heo, Hwaseong-si (KR); Sang Min Hong, Cheonan-si (KR); Heeseong Jeong, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 530 days.

(21) Appl. No.: 17/530,274

(22) Filed: Nov. 18, 2021

(65) Prior Publication Data
US 2022/0231102 A1 Jul. 21, 2022

(30) Foreign Application Priority Data
Jan. 19, 2021 (KR) .................. 10-2021-0007604

(51) Int. Cl.
| | | |
|---|---|---|
| *H10K 59/124* | (2023.01) | |
| *H10K 59/123* | (2023.01) | |
| *H10K 59/35* | (2023.01) | |
| *H10K 77/10* | (2023.01) | |

(52) U.S. Cl.
CPC ......... *H10K 59/124* (2023.02); *H10K 59/123* (2023.02); *H10K 59/352* (2023.02); *H10K 77/10* (2023.02)

(58) Field of Classification Search
CPC ........................ H10K 59/124; H10K 59/352
See application file for complete search history.

(56) References Cited

U.S. PATENT DOCUMENTS

| | | | |
|---|---|---|---|
| 8,586,970 B2 | 11/2013 | Oh et al. | |
| 10,651,426 B2 | 5/2020 | Park et al. | |
| 2006/0208631 A1* | 9/2006 | Kim | H10K 59/876 313/506 |
| 2016/0190213 A1* | 6/2016 | Kim | H10K 59/124 257/40 |
| 2018/0151842 A1* | 5/2018 | Park | H10K 50/8428 |
| 2019/0096976 A1* | 3/2019 | Jang | H01L 33/58 |
| 2021/0111366 A1* | 4/2021 | Chang | H10K 59/35 |

FOREIGN PATENT DOCUMENTS

| | | | |
|---|---|---|---|
| KR | 10-1074805 | 10/2011 | |
| KR | 10-2018-0062548 | 6/2018 | |
| TW | 201625594 A * | 7/2016 | ............ C09K 11/06 |

* cited by examiner

*Primary Examiner* — Evan G Clinton
(74) *Attorney, Agent, or Firm* — KILE PARK REED & HOUTTEMAN PLLC

(57) ABSTRACT

A display device includes a lower substrate, a planarization layer, a first light emission structure, and a second light emission structure. The lower substrate includes a first region and a second region. The planarization layer is disposed on the lower substrate, and has a first thickness in the first region and a second thickness, which is less than the first thickness, in the second region. The first light emission structure is provided in the first region and arranged on the planarization layer, and emits a first color of light. The second light emission structure is provided in the second region and arranged on the planarization layer, and emits the first color of light.

13 Claims, 8 Drawing Sheets

DISPLAY DEVICE

CROSS-REFERENCE TO RELATED APPLICATION

This application claims priority from and the benefit of Korean Patent Application No. 10-2021-0007604 filed on Jan. 19, 2021 which is hereby incorporated by reference for all purposes as if fully set forth herein.

BACKGROUND

Field

Embodiments of the inventive concepts relate generally to a display device and, more specifically, to a display device including a light emission structure.

Discussion of the Background

Flat panel display devices are used as display devices for replacing a cathode ray tube display device due to lightweight and thin characteristics thereof. As representative examples of such flat panel display devices, there are a liquid crystal display device and an organic light emitting display device.

The display device includes a lower substrate, light emission structures, an upper substrate, etc. In addition, an air gap exists between the light emission structures and the upper substrate. Due to the air gap, a light emitted from the light emission structures may be diffusely reflected (e.g., an interference phenomenon of light), and thus a rainbow defect may occur in which a luminance ripple strongly appears according to a viewing angle of a user of the display device. When a rainbow defect occurs, a display quality of the display device may be reduced.

The above information disclosed in this Background section is only for understanding of the background of the inventive concepts, and, therefore, it may contain information that does not constitute prior art.

SUMMARY

Devices constructed according to embodiments of the invention are capable of improving a display quality of a display device having an air gap between a light emission structure and an upper substrate.

Additional features of the inventive concepts will be set forth in the description which follows, and in part will be apparent from the description, or may be learned by practice of the inventive concepts.

Embodiments provide a display device including a light emission structure, with a planarization layer disposed on a lower substrate and having a first thickness in a first region of the lower substrate and having a second thickness less than the first thickness in a second region of the lower substrate.

According to an embodiment of the inventive concepts, a display device includes a lower substrate, a planarization layer, a first light emission structure, and a second light emission structure. The lower substrate includes a first region and a second region. The planarization layer is disposed on the lower substrate, and has a first thickness in the first region and a second thickness, which is less than the first thickness, in the second region. The first light emission structure is disposed in the first region on the planarization layer, and emits a first color of light. The second light emission structure is disposed in the second region on the planarization layer, and emits the first color of light.

The display device may further include an upper substrate disposed on the first and second light emission structures.

The first light emission structure may include a first lower electrode and a first light emission layer disposed on the first lower electrode, and the second light emission structure may include a second lower electrode and a second light emission layer disposed on the second lower electrode.

A first distance from a lower surface of the upper substrate to an upper surface of the planarization layer located in the first region may be less than a second distance from the lower surface of upper substrate to the upper surface of the planarization layer located in the second region.

A difference between the second distance and the first distance may be equal to about 0.1 micrometers or less.

An air gap may be formed between the first and second light emission structures and the upper substrate.

The display device may further include a first semiconductor element disposed in the first region on the lower substrate and a second semiconductor element disposed in the second region on the lower substrate. The planarization layer may cover the first and second semiconductor elements.

The planarization layer may include a first contact hole and a second contact hole. The first contact hole may be located in the first region, and may expose a part of the first semiconductor element. The second contact hole may be located in the second region, and may expose a part of the second semiconductor element. A first length of the first contact hole extending in a direction from the an upper surface of the planarization layer to a lower surface of the planarization layer may be greater than a second length of the second contact hole extending in the direction.

The display device may further include a third light emission structure and a fourth light emission structure. The third light emission structure may be disposed adjacent to the first light emission structure, and may emit a second color of light. The fourth light emission structure may be disposed adjacent to the first and third light emission structures, and may emit a third color of light.

The display device may further include a fifth light emission structure and a sixth light emission structure. The fifth light emission structure may be disposed adjacent to the second light emission structure, and may emit the second color of light. The sixth light emission structure may be disposed adjacent to the second and fifth light emission structures, and may emit the third color of light. The planarization layer on which the third and fourth light emission structures are disposed may have the first thickness, and the planarization layer on which the fifth and sixth light emission structures are disposed may have the second thickness.

According to another embodiment of the inventive concepts, a display device includes a lower substrate, a planarization layer, a first light emission structure, and a second light emission structure. The lower substrate includes a first region and a second region, and has a first thickness in the first region and a second thickness, which is less than the first thickness, in the second region. The planarization layer is disposed on the lower substrate. The first light emission structure is provided in the first region and arranged on the planarization layer, and emits a first color of light. The second light emission structure is provided in the second region and arranged on the planarization layer, and emits the first color of light.

The display device may further include an upper substrate disposed on the first and second light emission structures.

The display device may further include a first semiconductor element disposed in the first region on the lower substrate and a second semiconductor element disposed in the second region on the lower substrate. The planarization layer may cover the first and second semiconductor elements, and may have a same thickness in the first and second regions.

A first distance from a lower surface of the upper substrate to an upper surface of the planarization layer located in the first region may be less than a second distance from the lower surface of upper substrate to the upper surface of the planarization layer located in the second region.

The planarization layer may include a first contact hole and a second contact hole. The first contact hole may be located in the first region, and may expose a part of the first semiconductor element. The second contact hole may be located in the second region, and may expose a part of the second semiconductor element. A first length of the first contact hole extending in a direction from the an upper surface of the planarization layer to a lower surface of the planarization layer may be greater than a second length of the second contact hole extending in the direction.

According to yet another embodiment of the inventive concepts, a display device includes a lower substrate, a planarization layer, and a light emission structure. The lower substrate includes a first region and a second region located adjacent to the first region. The planarization layer is disposed on the lower substrate, and has a first thickness in the first region and a second thickness, which is less than the first thickness, in the second region. The light emission structure is provided in the first and second regions and arranged on the planarization layer, and emits a first color of light.

The planarization layer and the light emission structure may include a step in a boundary of the first and second regions.

The display device may further include a semiconductor elements disposed in the first region on the lower substrate and an upper substrate disposed on the light emission structure. A first distance from a lower surface of the upper substrate to an upper surface of the planarization layer located in the first region may be less than a second distance from the lower surface of upper substrate to the upper surface of the planarization layer located in the second region.

The planarization layer may be located in the first region or the second region, and may include a contact hole exposing a part of the semiconductor element. The light emission structure may be electrically connected to the semiconductor element through the contact hole, and an air gap may be formed between the light emission structure and the upper substrate.

The light emission structure may be continuously disposed in the first and second regions.

As the display device according to embodiments of the inventive concepts includes a planarization layer having different thicknesses in the first region where the first light emission structure is disposed and in the second region where the second light emission structure is disposed, heights where the first and second light emission layers emitting a same color of light are disposed may be differently designed. Accordingly, as the rainbow defect is improved, and a display quality of the display device may be relatively improved.

As the display device according to embodiments of the inventive concepts includes a lower substrate having different thicknesses in the first region where the first light emission structure is disposed and in the second region where the second light emission structure is disposed, heights where the first and second light emission layers emitting a same color of light are disposed may be differently designed. Accordingly, as the rainbow defect is improved, and a display quality of the display device may be relatively improved.

As the display device according to embodiments of the inventive concepts includes a planarization layer having different thicknesses in the first and second regions where the first light emission structure is disposed, a height of the first light emission layer may be differently designed in the first and second regions. Accordingly, as the rainbow defect is improved, and a display quality of the display device may be relatively improved.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Figure 1:
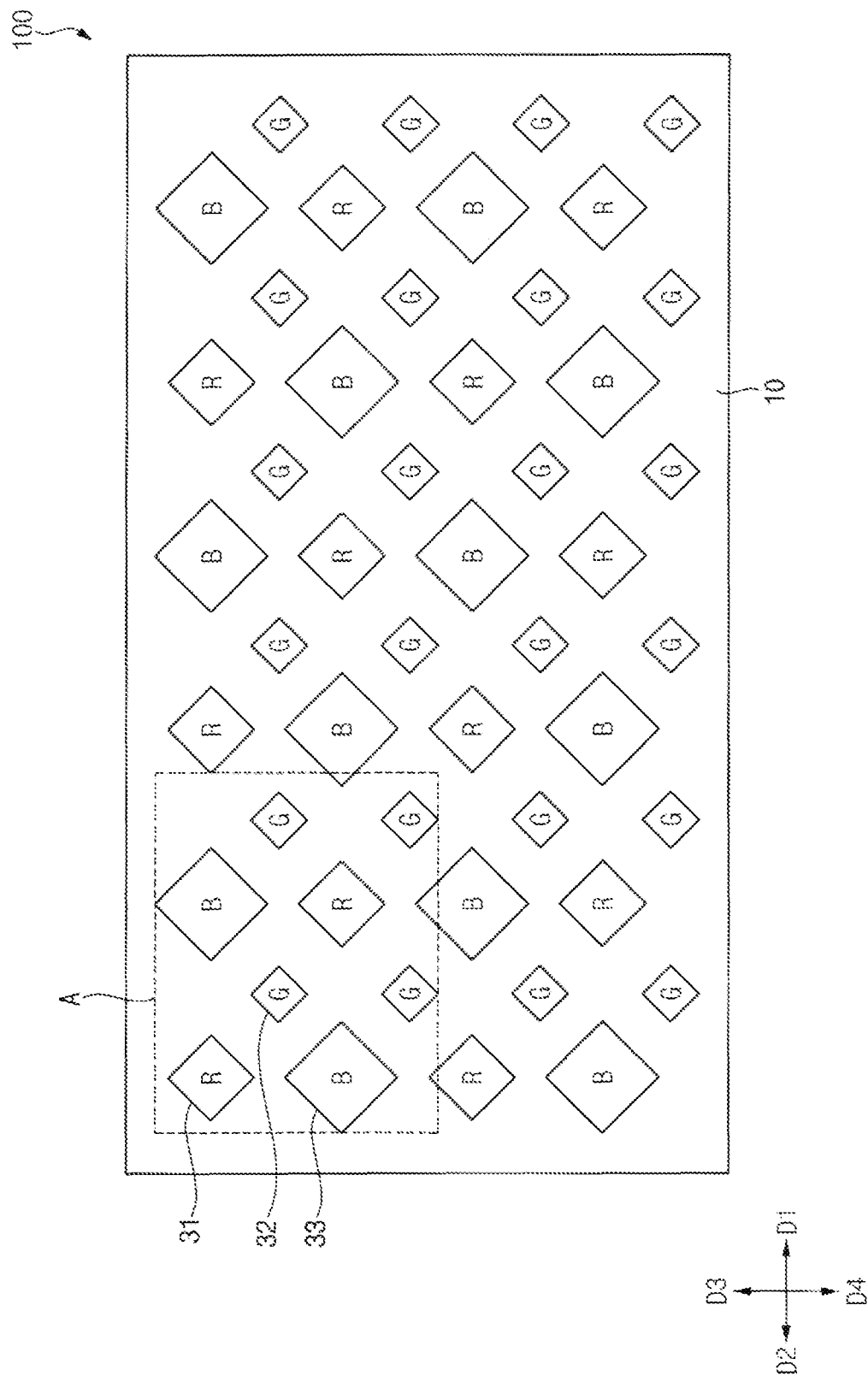
FIG. 1 is a plan view illustrating a display device according to embodiments of the inventive concepts that is constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various exemplary embodiments. Further, various embodiments may be different, but do not have to be exclusive. For example, specific shapes, configurations, and characteristics of an exemplary embodiment may be used or implemented in another embodiment without departing from the inventive concepts.

Unless otherwise specified, the illustrated embodiments are to be understood as providing features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the x-axis, the y-axis, and the z-axis are not limited to three axes of a rectangular coordinate system, such as the x, y, and z-axes, and may be interpreted in a broader sense. For example, the x-axis, the y-axis, and the z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the illustrative term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a plan view illustrating a display device according to embodiments of the inventive concepts that is constructed according to principles of the invention.

Referring to FIG. 1, a display device 100 may include a display region 10, and the display region 10 may include first, second, and third sub-pixel regions 31, 32, and 33.

The first to third sub-pixel regions 31, 32, and 33 may be repeatedly arranged in the display region 10. For example, the first sub-pixel region 31 and the third sub-pixel region 33 may be repeatedly arranged in a first row of the display region 10, and the second sub-pixel region 32 may be repeatedly arranged in a second row of the display region 10. In addition, the third sub-pixel region 33 and the first sub-pixel region 31 may be repeatedly arranged in a third row of the display region 10, and the second sub-pixel region 32 and the first sub-pixel region 31 may be repeatedly arranged in a fourth row of the display region 10. Further, the first sub-pixel region 31 and the third sub-pixel region 33 may be repeatedly arranged in a first column of the display region 10, and the second sub-pixel region 32 may be repeatedly arranged in a second column of the display region 10. In addition, the third sub-pixel region 33 and the first sub-pixel region 31 may be repeatedly arranged in a third column of the display region 10, and the second sub-pixel region 32 may be repeatedly arranged in a fourth column of the display region 10.

Figure 2:
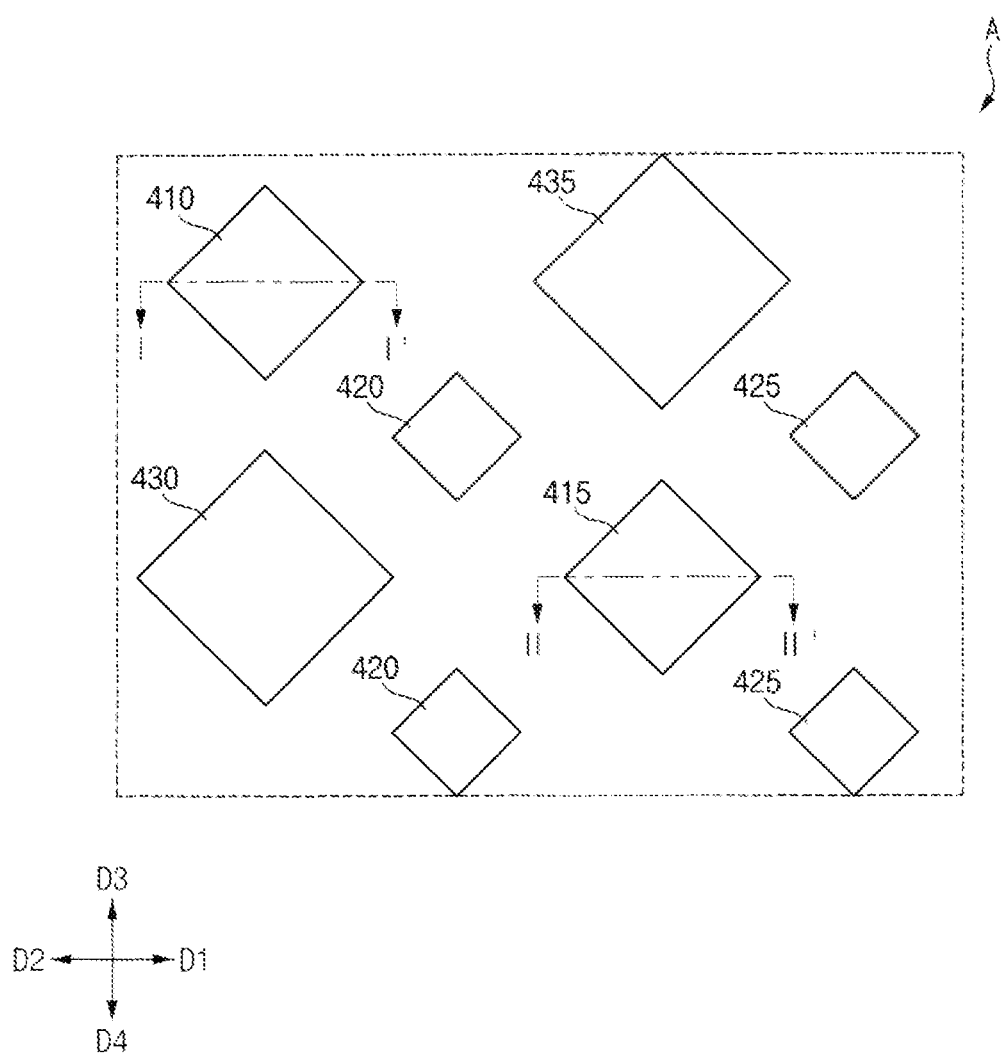
FIG. 2 is a partially enlarged plan view illustrating a region A of FIG. 1.

For example, a light emission structure (e.g., first and second light emission structures 410 and 415 of FIG. 2) emitting a red color of light may be disposed in the first sub-pixel region 31, and a light emission structure (e.g., third and fifth light emission structures 420 and 425 of FIG. 2) emitting a green color of light may be disposed in the second sub-pixel region 32. In addition, a light emission structure (e.g., fourth and sixth light emission structures 430 and 435 of FIG. 2) emitting a blue color of light may be disposed in the third sub-pixel region 33. That is, red-green-blue-green (RG-BG) light emission structures may be repeatedly arranged in the display device 100 (e.g., a PENTILE™ scheme).

However, although a shape of each of the first, second, and third sub-pixel regions 31, 32, and 33 has been illustrated as having a plan shape of a rhombus, the shape is not limited thereto. For example, a shape of each of the first, second, and third sub-pixel regions 31, 32, and 33 may have a plan shape of a triangle, a plan shape of a tetragon, a plan shape of a polygon, a plan shape of a circle, a plan shape of a track, or a plan shape of an ellipse.

In addition, sizes of each of the first, second, and third sub-pixel regions 31, 32, and 33 has been illustrated as having different sizes, but not being limited thereto. For example, sizes of the first, second, and third sub-pixel regions 31, 32, and 33 may be a same as each other.

Further, although it has been described that the first, second, and third sub-pixel regions 31, 32, and 33 are arranged by using the PENTILE™ scheme, a configuration of embodiments according to the inventive concepts is not limited thereto. For example, the first, second, and third sub-pixel regions 31, 32, and 33 may be arranged by using an RGB stripe scheme in which rectangles having a same size are sequentially arranged, an S-stripe scheme including a blue light emission structure having a relatively large area, a WRGB scheme further including a white light emission structure, or the like.

FIG. 2 is a partially enlarged plan view illustrating a region A of FIG. 1.

Referring to FIG. 2, first and the third sub-pixel regions 31 and 33 located in a first column of the display region 10, second sub-pixel region 32 located in a second column of the display region 10, the third and first sub-pixel regions 33 and 31 located in a third column of the display region 10, and the second sub-pixel region 32 located in a fourth column of the display region 10 are is illustrated. Here, the first sub-pixel region 31 and the third sub-pixel region 33 located in the first column and the second sub-pixel region 32 located in the second column may be defined as a first pixel region, and the third sub-pixel region 33 and the first sub-pixel region 31 located in the third column and the second sub-pixel region 32 located in the fourth column may be defined as a second pixel region. The first pixel region and the second pixel region may be located adjacent to each other.

In the first pixel region, a first light emission structure 410 may be disposed in the first sub-pixel region 31 located in the first column, a third light emission structure 420 may be disposed in the second sub-pixel region 32 located in the second column, and a fourth light emission structure 430 may be disposed in the third sub-pixel region 33 located in the first column.

In the second pixel region, a second light emission structure 415 may be disposed in the first sub-pixel region 31 located in the third column, a fifth light emission structure 425 may be disposed in the second sub-pixel region 32 located in the fourth column, and a sixth light emission structure 435 may be disposed in the third sub-pixel region 33 located in the third column.

In embodiments, the first light emission structure 410 and the second light emission structure 415 may emit a same color (e.g., a first color) of light, and may be disposed adjacent to each other. In addition, the third light emission structure 420 and the fifth light emission structure 425 may emit a same color (e.g., a second color) of light, and may be disposed adjacent to each other. Further, the fourth light emission structure 430 and the sixth light emission structure 435 may emit a same color (e.g., a third color) of light, and may be disposed adjacent to each other.

Figure 3:
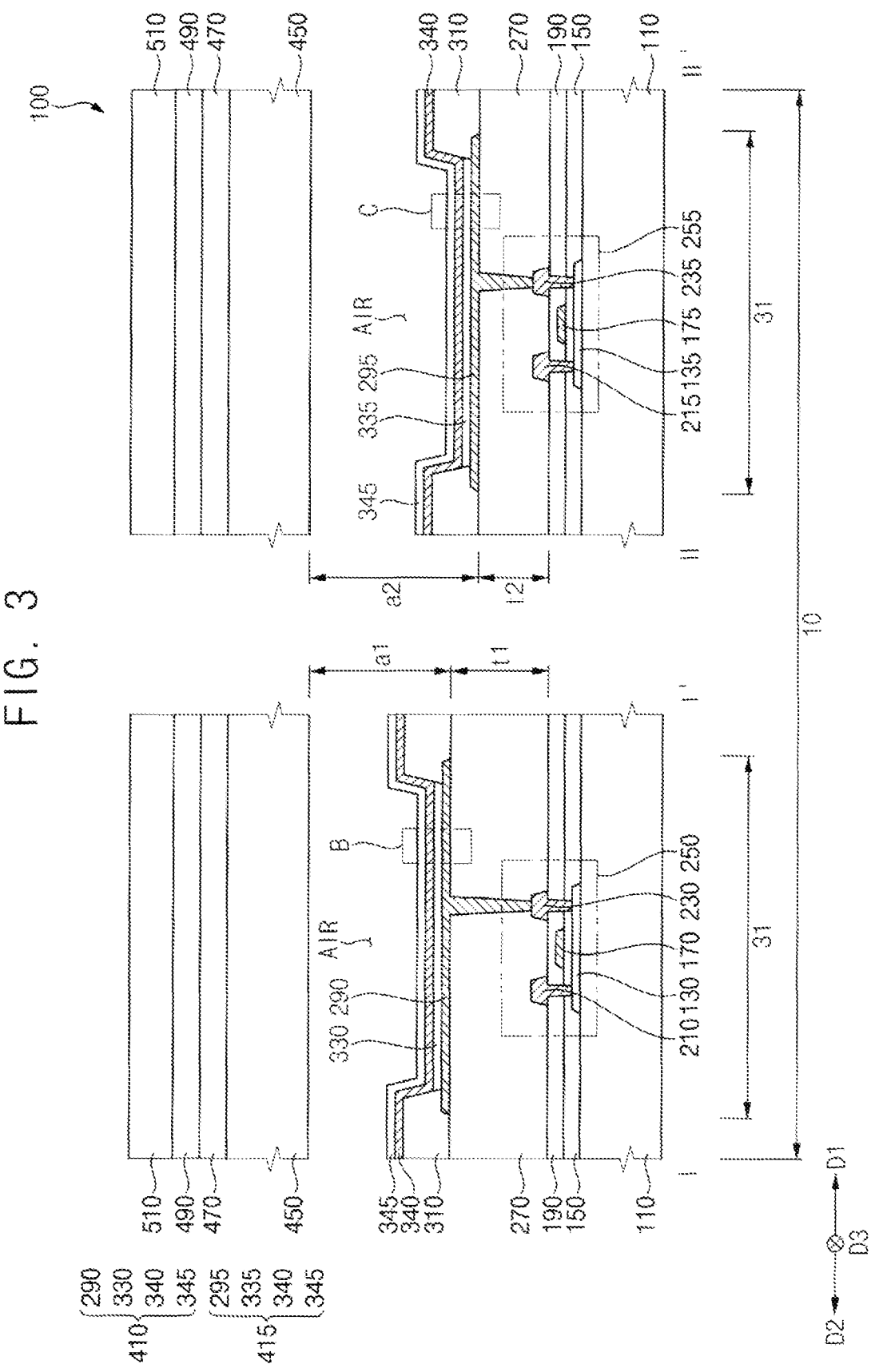
FIG. 3 is a cross-sectional view taken along lines I-I' and II-II' of FIG. 2.
Figure 4:
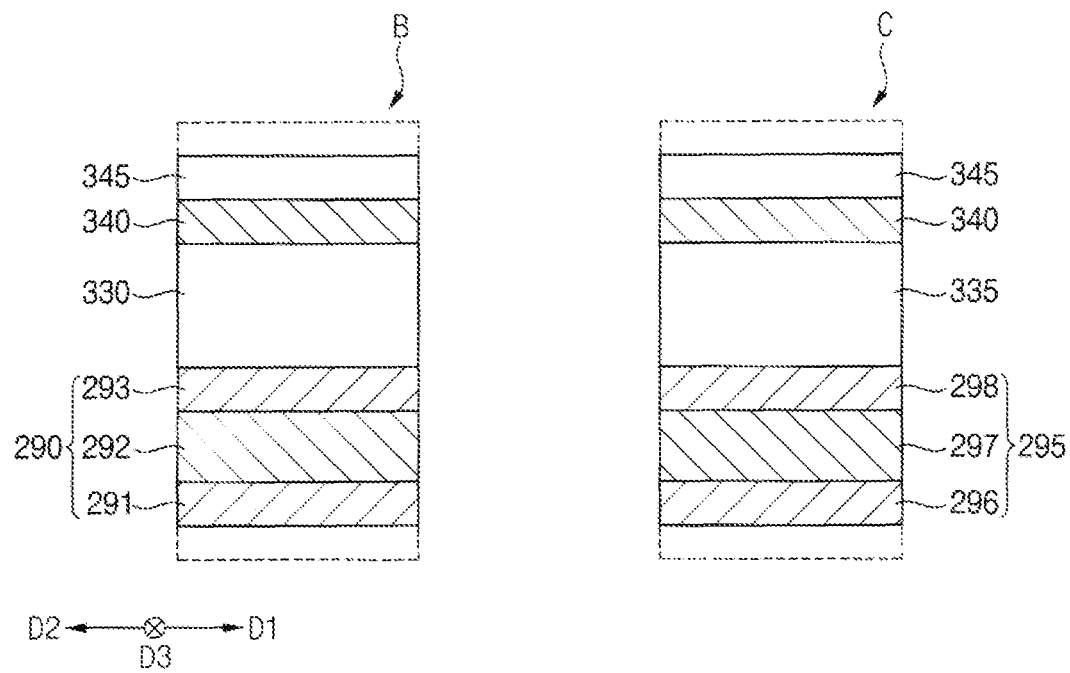
FIG. 4 is partially enlarged plan views illustrating regions B and C of FIG. 3.
Figure 5:
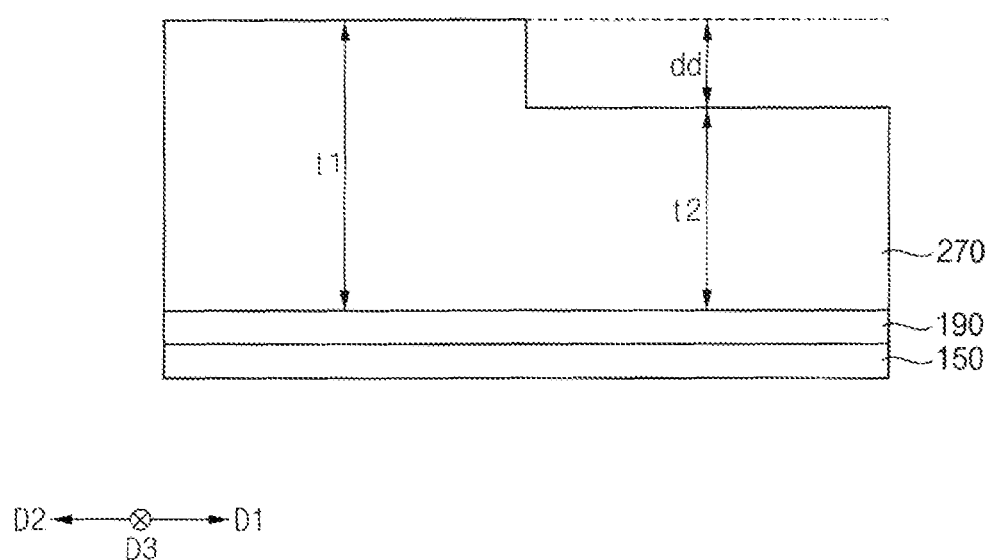
FIG. 5 is a cross-sectional view for describing a planarization layer of FIG. 3.

FIG. 3 is a cross-sectional view taken along lines I-I' and II-II' of FIG. 2, FIG. 4 is partially enlarged plan views illustrating regions B and C of FIG. 3, and FIG. 5 is a cross-sectional view for describing a planarization layer of FIG. 3.

Referring to FIGS. 2, 3, 4, and 5, a display device 100 may include a lower substrate 110, a first semiconductor element 250, a second semiconductor element 255, a planarization layer 270, a pixel defining layer 310, a first light emission structure 410, a second light emission structure 415, a third light emission structure 420, a fifth light emission structure 425, a fourth light emission structure 430, a sixth light emission structure 435, an upper substrate 450, a sensing structure 470, a polarizing structure 490, a cover window 510, etc. Here, the first light emission structure 410 may include a first lower electrode 290, a first light emission layer 330, an upper electrode 340, and a capping layer 345, and the first lower electrode 290 may include a first electrode layer 291, a first reflective electrode layer 292, and a second electrode layer 293, as illustrated in FIG. 4. In addition, the second light emission structure 415 may include a second lower electrode 295, a second light emission layer 335, the upper electrode 340, and the capping layer 345, and the second lower electrode 295 may include a third electrode layer 296, a second reflective electrode layer 297, and a fourth electrode layer 298, as illustrated in FIG. 4. That is, the upper electrode 340 and the capping layer 345 may be commonly included in the first light emission structure 410 and the second light emission structure 415. Further, the first semiconductor element 250 may include a first active layer 130, a gate insulation layer 150, a first gate electrode 170, an insulating interlayer 190, a first source electrode 210, and a first drain electrode 230, and the second semiconductor element 255 may include a second active layer 135, the gate insulation layer 150, a second gate electrode 175, the insulating interlayer 190, a second source electrode 215, and a second drain electrode 235. That is, the gate insulation layer 150 and the insulating interlayer 190 may be commonly included in the first semiconductor element 250 and the second semiconductor element 255.

In embodiments, the planarization layer 270 may have a first thickness t1 under the first light emission structure 410, and may have a second thickness t2 under the second light emission structure 415. Here, the first thickness t1 may be greater than the second thickness t2.

The lower substrate 110 including a transparent or opaque material may be provided. The lower substrate 110 may include a quartz substrate, a synthetic quartz substrate, a calcium fluoride substrate, a fluorine-doped quartz (i.e., F-doped quartz) substrate, a soda lime glass substrate, a non-alkali glass substrate, or the like.

In other embodiments, the lower substrate 110 may be configured as a transparent resin substrate having flexibility. Examples of the transparent resin substrate that is used as the lower substrate 110 may include a polyimide substrate. In this case, the polyimide substrate may have a stacked structure including a first polyimide layer, a barrier film layer, a second polyimide layer, and the like.

As the display device 100 includes the display region 10 including the first, second, and third sub-pixel regions 31, 32, and 33, the lower substrate 110 may be divided as the first, second, and third sub-pixel regions 31, 32, and 33 and the display region 10. For convenience of description, the first sub-pixel region 31 in which the first light emission structure 410 is disposed is defined as a first region, and the first sub-pixel region 31 in which the second light emission structure 415 is disposed is defined as a second region.

The first active layer 130 may be disposed in the first region on the lower substrate 110. For example, the first active layer 130 a metal oxide semiconductor, an inorganic semiconductor (e.g., amorphous silicon or poly silicon), an organic semiconductor, or the like. The first active layer 130 may include a source region, a drain region, a channel region located between the source region and the drain region.

The second active layer 135 may be disposed in the second region on the lower substrate 110. For example, the second active layer 135 and the first active layer 130 may have a same structure, and may include same materials. The second active layer 135 may include a source region, a drain region, a channel region located between the source region and the drain region.

The gate insulation layer 150 may be disposed on the lower substrate 110, the first active layer 130, and the second active layer 135. For example, the gate insulation layer 150 may sufficiently cover the first and second active layers 130 and 135 on the lower substrate 110, and may have a substantially flat upper surface without creating a step around the first and second active layers 130 and 135. Alternatively, the gate insulation layer 150 may cover the first and second active layers 130 and 135 on the lower substrate 110, and may be disposed along a profile of the first and second active layers 130 and 135 with a uniform thickness. The gate insulation layer 150 may include a silicon compound, metal oxide, or the like. For example, the gate insulation layer 150 may include silicon oxide ($SiO_X$), silicon nitride ($SiN_X$), silicon oxynitride ($SiO_XN_Y$), silicon oxycarbide ($SiO_XC_Y$), silicon carbonitride ($SiC_XN_Y$), aluminum oxide ($AlO_X$), aluminum nitride ($AlN_X$), tantalum oxide ($TaO_X$), hafnium oxide ($HfO_X$), zirconium oxide ($ZrO_X$), titanium oxide ($TiO_X$), and the like. In other embodiments, the gate insulation layer 150 may have a multi-layer structure including a plurality of insulation layers. For example, the insulation layers may have mutually different thicknesses, or may include mutually different materials.

The first gate electrode 170 may be disposed in the first region on the gate insulation layer 150. In other words, the first gate electrode 170 may be located to overlap the channel region of the first active layer 130. The first gate electrode 170 may include a metal, an alloy of a metal, metal nitride, conductive metal oxide, a transparent conductive material, or the like. For example, the first gate electrode 170 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), an aluminum-containing alloy, aluminum nitride ($AlN_X$), a silver-containing alloy, tungsten nitride ($WN_X$), a copper-containing alloy, a molybdenum-containing alloy, titanium nitride ($TiN_X$), chromium nitride ($CrN_X$), tantalum nitride ($TaN_X$), strontium ruthenium oxide ($SrRu_XO_Y$), zinc oxide ($ZnO_X$), indium tin oxide (ITO), tin oxide ($SnO_X$), indium oxide ($InO_X$), gallium oxide ($GaO_X$), indium zinc oxide (IZO), or the like. These may be used alone or in combination with each other. In other embodiments, the first gate electrode 170 may have a multi-layer structure including a plurality of metal layers. For example, the metal layers may have mutually different thicknesses, or may include mutually different materials.

The second gate electrode 175 may be disposed in the second region on the gate insulation layer 150. In other words, the second gate electrode 175 may be located to overlap the channel region of the second active layer 135. The second gate electrode 175 may include a metal, an alloy of a metal, metal nitride, conductive metal oxide, a transparent conductive material, and the like. For example, the second gate electrode 175 and the first gate electrode 170 may have a same structure, and may include same materials. The second gate electrode 175 may have a multi-layer structure including a plurality of metal layers. For example, the metal layers may have mutually different thicknesses, or may include mutually different materials.

The insulating interlayer 190 may be disposed on the gate insulation layer 150, the first gate electrode 170, and the second gate electrode 175. For example, the insulating interlayer 190 may sufficiently cover the first and second gate electrodes 170 and 175 on the gate insulation layer 150, and may have a substantially flat upper surface without creating a step around the first and second gate electrodes 170 and 175. Alternatively, the insulating interlayer 190 may cover the first and second gate electrodes 170 and 175 on the gate insulation layer 150, and may be disposed along a profile of the first and second gate electrodes 170 and 175 with a uniform thickness. The insulating interlayer 190 may include a silicon compound, metal oxide, or the like. In other embodiments, the insulating interlayer 190 may have a multi-layer structure including a plurality of insulation layers. For example, the insulation layers may have mutually different thicknesses, or may include mutually different materials.

The first source electrode 210 and the first drain electrode 230 may be disposed in the first region on the insulating interlayer 190. The first source electrode 210 may be connected to the source region of the first active layer 130 through a contact hole formed by removing a first portion of the gate insulation layer 150 and the insulating interlayer 190. In addition, the first drain electrode 230 may be connected to the drain region of the first active layer 130 through a contact hole formed by removing a second portion of the gate insulation layer 150 and the insulating interlayer 190. Each of the first source electrode 210 and the first drain electrode 230 may include a metal, an alloy of a metal, metal nitride, conductive metal oxide, a transparent conductive material, or the like. These may be used alone or in combination with each other. In other embodiments, each of the first source electrode 210 and the first drain electrode 230 may have a multi-layer structure including a plurality of metal layers. For example, the metal layers may have mutually different thicknesses, or may include mutually different materials.

Accordingly, the first semiconductor element 250 including the first active layer 130, the gate insulation layer 150, the first gate electrode 170, the insulating interlayer 190, the first source electrode 210, and the first drain electrode 230 may be disposed.

The second source electrode 215 and the second drain electrode 235 may be disposed in the second region on the insulating interlayer 190. The second source electrode 215 may be connected to the source region of the second active layer 135 through a contact hole formed by removing a third portion of the gate insulation layer 150 and the insulating interlayer 190. In addition, the second drain electrode 235 may be connected to the drain region of the second active layer 135 through a contact hole formed by removing a fourth portion of the gate insulation layer 150 and the insulating interlayer 190. Each of the second source electrode 215 and the second drain electrode 235 and each of the first source electrode 210 and the first drain electrode 230 may have a same structure, and may include same materials. In other embodiments, each of the second source electrode 215 and the second drain electrode 235 may have a multi-layer structure including a plurality of metal layers. For example, the metal layers may have mutually different thicknesses, or may include mutually different materials.

Accordingly, the second semiconductor element 255 including the second active layer 135, the gate insulation layer 150, the second gate electrode 175, the insulating interlayer 190, the second source electrode 215, and the second drain electrode 235 may be disposed.

In addition, a semiconductor element may also be disposed under the third, fourth, fifth, and sixth light emission structures 420, 430, 425, and 435.

However, although the display device 100 has been described as having a configuration including two transistors (e.g., the first semiconductor element 250 and the second semiconductor element 255), the configuration of embodiments according to the inventive concepts is not limited thereto. For example, the display device 100 may include at least two transistors and at least one capacitor under each of the first light emission structure 410 and the second light emission structure 415.

The planarization layer 270 may be disposed on the insulating interlayer 190 and the first and second semiconductor elements 250 and 255. The planarization layer 270 may be disposed as a relatively thick thickness to sufficiently cover the first and second semiconductor elements 250 and 255. The planarization layer 270 may include an organic insulating material, an inorganic insulating material, or the like. In embodiments, the planarization layer 270 may include an organic insulating material. For example, the planarization layer 270 may include a photoresist, a polyacryl-based resin, a polyimide-based resin, a polyamide-based resin, a siloxane-based resin, an acryl-based resin, an epoxy-based resin, or the like.

In embodiments, the planarization layer 270 may have a first thickness t1 in the first region, and may have a second thickness t2 in the second region. Here, the first thickness t1 may be greater than the second thickness t2. That is, the planarization layer 270 may have a step. For example, in a manufacturing process of the display device 100, the step of the planarization layer 270 may be formed by using a half tone mask. For example, as illustrated in FIG. 5, a difference dd between the first thickness t1 and the second thickness t2 may be about 0.1 micrometers or less.

Accordingly, a distance from an upper surface of the planarization layer 270 to a lower surface of the upper substrate 450 in the first region may be defined as a first distance a1, and a distance from the upper surface of the planarization layer 270 to the lower surface of the upper substrate 450 in the second region may be defined as a second distance a2. In embodiments, since the planarization layer 270 has the first thickness t1 in the first region and the second thickness t2 in the second region, the second distance a2 may be greater than the first distance a1.

In addition, a first contact hole exposing a part of the first semiconductor element 250 (e.g., a part of the first drain electrode 230) may be formed in the first region of the planarization layer 270, and a second contact hole exposing a part of the second semiconductor element 255 (e.g., a part of the second drain electrode 235) may be formed in the second region of the planarization layer 270. In embodiments, a first length of the first contact hole extending in a direction from an upper surface of the planarization layer 270 to a lower surface of the planarization layer 270 may be greater than a second length of the second contact hole extending in the direction.

Referring again to FIGS. 3 and 4, the first lower electrode 290 may be disposed in the first region on the planarization layer 270, and may be electrically connected to the first semiconductor element 250 through the first contact hole. For example, the first electrode layer 291 may be disposed in the first region on the planarization layer 270. The first reflective electrode layer 292 and the second electrode layer 293 may be sequentially disposed on the first electrode layer 291. That is, the first reflective electrode layer 292 may be interposed between the first electrode layer 291 and the second electrode layer 293. Here, the first electrode layer 291 may include a substantially same as the second electrode layer 293, and a thickness of each of the first electrode layer 291 and the second electrode layer 293 may be less than a thickness of the first reflective electrode layer 292.

The first electrode layer 291 may cover an uneven top surface of the planarization layer 270. Since the first electrode layer 291 is disposed on the planarization layer 270, the first electrode layer 291 may assist in forming the first reflective electrode layer 292. Since the second electrode layer 293 is disposed on the first reflective electrode layer 292, color coordinates of the display device 100 may be easily adjusted. Here, the first reflective electrode layer 292 may function as a light reflection layer. The first reflective electrode layer 292 may reflect light emitted from the first light emission layer 330 toward a front surface of the display device 100 (e.g., in a direction from the lower substrate 110 to the upper substrate 450). Thus, the first lower electrode 290 including the first reflective electrode layer 292 may be substantially opaque. In other embodiments, the first lower electrode 290 may have a multi-layer structure including the first electrode layer 291 and the first reflective electrode layer 292, or may have a single-layer structure including the first reflective electrode layer 292. For example, the first reflective electrode layer 292 may include Au, Ag, Al, Pt, Ni, Ti, Pd, Mg, Ca, Li, Cr, Ta, W, Cu, Mo, Sc, Nd, Ir, or the like. Otherwise, the first reflective electrode layer 292 may include an alloy of a metal, metal nitride, conductive metal oxide, or the like. For example, the first reflective electrode layer 292 may include an aluminum-containing alloy, $AlN_X$, a silver-containing alloy, $WN_X$, a copper-containing alloy, a molybdenum-containing alloy, $TiN_X$, $CrN_X$, $TaN_X$, $SrRu_XO_Y$, $ZnO_X$, $SnO_X$, $InO_X$, $GaO_X$, or the like. These may be used alone or in combination with each other. Each of the first electrode layer 291 and the second electrode layer 293 may be substantially transparent, may include a transparent conductive material, or the like. For example, each of the first electrode layer 291 and the second electrode layer 293 may include $ZnO_X$, ITO, $SnO_X$, $InO_X$, $GaO_X$, IZO, or the like.

The second lower electrode 295 may be disposed in the second region on the planarization layer 270, and may be electrically connected to the second semiconductor element 255 through the second contact hole. For example, the third electrode layer 296 may be disposed in the second region on the planarization layer 270. The second reflective electrode layer 297 and the fourth electrode layer 298 may be sequentially disposed on the third electrode layer 296. That is, the second reflective electrode layer 297 may be interposed between the third electrode layer 296 and the fourth electrode layer 298. Here, the third electrode layer 296 may include a substantially same as the fourth electrode layer 298, and a thickness of each of the third electrode layer 296 and the fourth electrode layer 298 may be less than a thickness of the second reflective electrode layer 297.

The third electrode layer 296 may cover an uneven top surface of the planarization layer 270. Since the third electrode layer 296 is disposed on the planarization layer 270, the third electrode layer 296 may assist in forming the second reflective electrode layer 297. Since the fourth electrode layer 298 is disposed on the second reflective electrode layer 297, color coordinates of the display device 100 may be easily adjusted. Here, the second reflective electrode layer 297 may function as a light reflection layer. The second reflective electrode layer 297 may reflect light emitted from the second light emission layer 335 toward a front surface of the display device 100. Thus, the second lower electrode 295 including the second reflective electrode layer 297 may be substantially opaque. That is, the second lower electrode 295 and the first lower electrode 290 may have a same structure, and may include same materials.

In embodiments, a first distance from a lower surface of the upper substrate 450 to an upper surface of the first lower electrode 290 may be less than a second distance from the lower surface of the upper substrate 450 to an upper surface of the second lower electrode 295. In addition, a difference between the second distance and the first distance may be about 0.1 micrometers or less. In other words, as the difference dd between the first thickness t1 of the planarization layer 270 located in the first region and the second thickness t2 of the planarization layer 270 located in the second region is about 0.1 micrometers or less, the difference between the second distance and the first distance may be about 0.1 micrometers or less.

The pixel defining layer 310 may be disposed on a part of the first lower electrode 290, a part of the second lower electrode 295, and the planarization layer 270. The pixel defining layer 310 may cover both lateral portions of the first lower electrode 290 and both lateral portions of the second lower electrode 295. For example, the pixel defining layer 310 may surround a periphery of each of the first and second regions. The pixel defining layer 310 may include an organic insulating material, an inorganic insulating material, or the like. In embodiments, the pixel defining layer 310 may include an organic insulating material.

The first light emission layer 330 may be disposed on the first lower electrode 290. The first light emission layer 330 may have a multi-layer structure including an organic light emission layer ("EML"), a hole injection layer ("HIL"), a hole transport layer ("HTL"), an electron transport layer ("ETL"), an electron injection layer ("EIL"), and the like. In embodiments, the EML of the first light emission layer 330 may be formed using at least one of light emission materials capable of emitting a first color of light (e.g., a red color of light). Otherwise, the EML of the first light emission layer 330 may be formed by laminating a plurality of light emission materials capable of emitting different colors of light such as a red color of light, a green color of light, or a blue color of light to emit a white color of light as a whole. In this case, a color filter may be disposed on the first light emission structure 410. The color filter may include a red color filter. The color filter may include a photosensitive resin or color photoresist.

The second light emission layer 335 may be disposed on the second lower electrode 295. The second light emission layer 335 may have a multi-layer structure including the EML, the HIL, the HTL), the ETL), the EIL, and the like. In embodiments, the EML of the second light emission layer 335 may be formed using at least one of light emission materials capable of emitting the first color of light (e.g., the red color of light). Otherwise, the EML of the second light emission layer 335 may be formed by laminating a plurality of light emission materials capable of emitting different colors of light such as a red color of light, a green color of light, or a blue color of light to emit a white color of light as a whole. In this case, a color filter may be disposed on the second light emission structure 415. The color filter may include a red color filter. The color filter may include a photosensitive resin or color photoresist. That is, the second light emission layer 335 and the first light emission layer 330 may have a same structure, and may include same materials.

The upper electrode 340 may be disposed on the pixel defining layer 310, the first light emission layer 330, and the second light emission layer 335. The upper electrode 340 may include a metal, an alloy of a metal, metal nitride, conductive metal oxide, a transparent conductive material, or the like. These may be used alone or in combination with each other. In other embodiments, the upper electrode 340 may have a multi-layer structure including a plurality of metal layers. For example, the metal layers may have mutually different thicknesses, or may include mutually different materials.

The capping layer 345 may be disposed on the upper electrode 340. For example, the capping layer 345 may cover the upper electrode 340, and may be disposed along a profile of the upper electrode 340 with a uniform thickness. Alternatively, the capping layer 345 may sufficiently cover the upper electrode 340, and may have a substantially flat upper surface without creating a step around the upper electrode 340. The capping layer 345 may include an organic insulating material, an inorganic insulating material, or the like. In other embodiments, the capping layer 345 may have a multi-layer structure including a plurality of insulation layers. For example, the insulation layers may have mutually different thicknesses, or may include mutually different materials.

Accordingly, the first light emission structure 410 including the first lower electrode 290, the first light emission layer 330, the upper electrode 340, and the capping layer 345 may be disposed in the first region on the planarization layer 270, and the second light emission structure 415 including the second lower electrode 295, the second light emission layer 335, the upper electrode 340, and the capping layer 345 may be disposed in the second region on the planarization layer 270.

In embodiments, as illustrated in FIG. 3, an air gap may be filled between the upper substrate 450 and the first and second light emission structures 410 and 415. In other words, the air gap may be formed between the upper substrate 450 and the first and second light emission structures 410 and 415. In addition, since the planarization layer 270 has the first thickness t1 and the second thickness t2 in the second region, a level of the first light emission structure 410 may be higher than a level of the second light emission structure 415 in a direction from the lower substrate 110 to the upper substrate 450. For example, the first light emission structure 410 may be located closer to a lower surface of the upper substrate 450 than the second light emission structure 415. In other words, a first thickness of the air gap located between the first light emission structure 410 and the upper substrate 450 may be different from a second thickness of the air gap located between the first light emission structure 410 and the upper substrate 450. That is, the first thickness of the air gap may be less than the second thickness of the air gap.

For example, in a conventional display device, a planarization layer disposed under light emission structures may be designed to have a same thickness. In other words, a distance between each of the light emission structures and a lower surface of an upper substrate may be the same. In addition, an air gap may exist between the light emission structures and a lower surface of an upper substrate, and light emitted from a light emission layer may be diffusely reflected (e.g., an interference phenomenon of light), when the air gap exists. In this case, a rainbow defect may occur in which a luminance ripple relatively strongly appears according to a viewing angle of a user of the conventional display device. When a rainbow defect occurs, a display quality of the display device may be reduced.

In embodiments, when a thickness of the planarization layer 270 disposed under the first and second light emission structures 410 and 415 which emit a same color of light is designed to have different thicknesses, a thickness of the air gap located on the first and second light emission structures 410 and 415 may be different, and a diffuse reflection of light emitted from the first and second light emission structures 410 and 415 in the first and second regions may be different. That is, a luminance ripple of the first light emission structure 410 according to viewing angles and a luminance ripple of the second light emission structure 415 according to viewing angles may be different from each other. In addition, as the luminance ripple of the first light emission structure 410 and a luminance ripple of the third light emission structure 420 are combined (or offset), the rainbow defect may be improved.

Referring again to FIG. 3, the upper substrate 450 may be disposed on the first light emission structure 410 and the second light emission structure 415. The upper substrate 450 may face the lower substrate 110 or may be opposite to the lower substrate 110. The upper substrate 450 and the lower substrate 110 may include substantially same materials. For example, the upper substrate 450 may include a quartz substrate, a synthetic quartz substrate, a calcium fluoride substrate, a fluorine-doped quartz substrate, a soda lime glass substrate, a non-alkali glass substrate, or the like.

A sealing member may be disposed in an outmost periphery between the lower substrate 110 and the upper substrate 450. The sealing member may be in contact with a lower surface of the upper substrate 450 and an upper surface of the lower substrate 110. Alternatively, at least one insulation layer may be interposed between a lower surface of the sealing member and the upper surface of the lower substrate 110. In embodiments, the sealing member may include a non-conductive material. For example, the sealing member may include a frit, and the like. In addition, the sealing member may additionally include a photocurable material. For example, the sealing member may include a mixture of an organic material and a photocurable material, and the mixture may be irradiated with ultraviolet (UV) rays, laser light, visible light, or the like so as to be cured so that the sealing member may be obtained. The photocurable material included in the sealing member may include an epoxy acrylate-based resin, a polyester acrylate-based resin, a urethane acrylate-based resin, a polybutadiene acrylate-based resin, a silicon acrylate-based resin, an alkyl acrylate-based resin, and the like.

For example, laser light may be irradiated onto the mixture of the organic material and the photocurable material. As the laser light is irradiated, the mixture may be changed from a solid state to a liquid state, and the mixture in the liquid state may be cured into the solid state after a predetermined time. The upper substrate 450 may be combined with the lower substrate 110 while being sealed with respect to the first substrate 110 according to the state change of the mixture.

The sensing structure 470 may be disposed on the upper substrate 450. For example, the sensing structure 470 may be substantially transparent, and light emitted from the first and second light emission structures 410 and 415 may pass through the sensing structure 470. The sensing structure 470 may include sensing electrodes. The sensing structure 470 may detect a part of a body of a user, an object, or the like located in a front surface of the display device 100 through the sensing electrode. In embodiments, the sensing electrode may include a proximity sensor electrode for detecting whether a user or an object that are positioned above the front surface of the display device 100 becomes closer or a touch sensor electrode for detecting a contact with a part of the user's body. The sensing electrodes may include carbon nanotube (CNT), transparent conductive oxide (TCO), ITO, indium gallium zinc oxide (IGZO), ZnO, graphene, silver nanowire (AgNW), Cu, Cr, or the like.

The polarizing structure 490 may be disposed on the sensing structure 470. The polarizing structure 490 may block external light incident from an outside. For example, the polarizing structure 490 may include a linear polarizing film and a $\lambda/4$ phase retardation film. The $\lambda/4$ phase retardation film may be disposed on the sensing structure 470. The $\lambda/4$ phase retardation film may convert a phase of light. For example, the $\lambda/4$ phase retardation film may convert vertically oscillating light or horizontally oscillating light into right circular polarization light or left circular polarization light, and may convert the right circular polarization light or the left circular polarization light into the vertically oscillating light or the horizontally oscillating light. The $\lambda/4$ phase retardation film may include a birefringent film including a polymer, an alignment film formed of a liquid crystal polymer, a film including an alignment layer formed of a liquid crystal polymer, and the like.

The linear polarizing film may be disposed on the $\lambda/4$ phase retardation film. The linear polarizing film may selectively transmit light. For example, the linear polarizing film may transmit the vertically oscillating light or the horizontally oscillating light. In this case, the linear polarizing film may have a horizontal line pattern or a vertical line pattern. When the linear polarizing film includes the horizontal line pattern, the linear polarizing film may block the vertically oscillating light, and may transmit the horizontally oscillating light. When the linear polarizing film has the vertical line pattern, the linear polarizing film may block the horizontally oscillating light, and may transmit the vertically oscillating light. The linear polarizing film may include an iodine-based material, a dye-containing material, a polyene-based material, and the like. In other embodiments, the polarizing structure 490 is disposed on the upper substrate 450, and the sensing structure 470 may be disposed on the polarizing structure 490.

The cover window 510 may be disposed on the polarizing structure 490. The cover window 510 may protect the polarizing structure 490, the sensing structure 470, the first light emission structure 410, the second light emission structure 415, and the like. The cover window 510 may include a tempered glass, tempered plastic, or the like.

Accordingly, the display device 100 including the lower substrate 110, the first semiconductor element 250, the second semiconductor element 255, the planarization layer 270, the pixel defining layer 310, the first light emission structure 410, the second light emission structure 415, the third light emission structure 420, the fifth light emission structure 425, the fourth light emission structure 430, the sixth light emission structure 435, the upper substrate 450, the sensing structure 470, the polarizing structure 490, the cover window 510, and the like may be provided.

As the display device 100 according to embodiments of the inventive concepts includes the planarization layer 270 having different thicknesses in the first region where the first light emission structure 410 is disposed and in the second region where the second light emission structure 415 is disposed, levels (i.e., positions or height) where the first and second light emission layers 330 and 335 emitting a same color of light are disposed may be differently designed. Accordingly, as the rainbow defect is improved, a display quality of the display device 100 may be relatively improved.

However, although one or more embodiments of the inventive concepts have been described that only a height of the planarization layer 270 located under the first and second light emission structures 410 and 415 is designed to be different, a configuration of embodiments according to the inventive concepts is not limited thereto. For example, in other embodiments, a height of the planarization layer 270 located under the third and fifth light emission structure 420 and 425 emitting a second color of light may be designed to be different, and a height of the planarization layer 270 located under the fourth and sixth light emission structure 430 and 435 emitting a third color of light may be designed to be different. In other words, a height of the planarization layer 270 located under light emission structures emitting a same color of light may be designed to be different. In this case, the planarization layer 270 located under the first, third, and fourth light emission structure 410, 420, and 430 may have the first thickness t1, and the planarization layer 270 located under the second, fifth, and sixth light emission structure 415, 425, and 435 may have the second thickness t2.

In addition, although the display device 100 according to embodiments of the inventive concepts is described by limiting an organic light emitting display device, a configuration of embodiments according to the inventive concepts is not limited thereto. In other embodiments, the display device 100 may include a liquid crystal display device (LCD), a field emission display device (FED), a plasma display device (PDP), and an electrophoretic display device (EPD).

Figure 6:
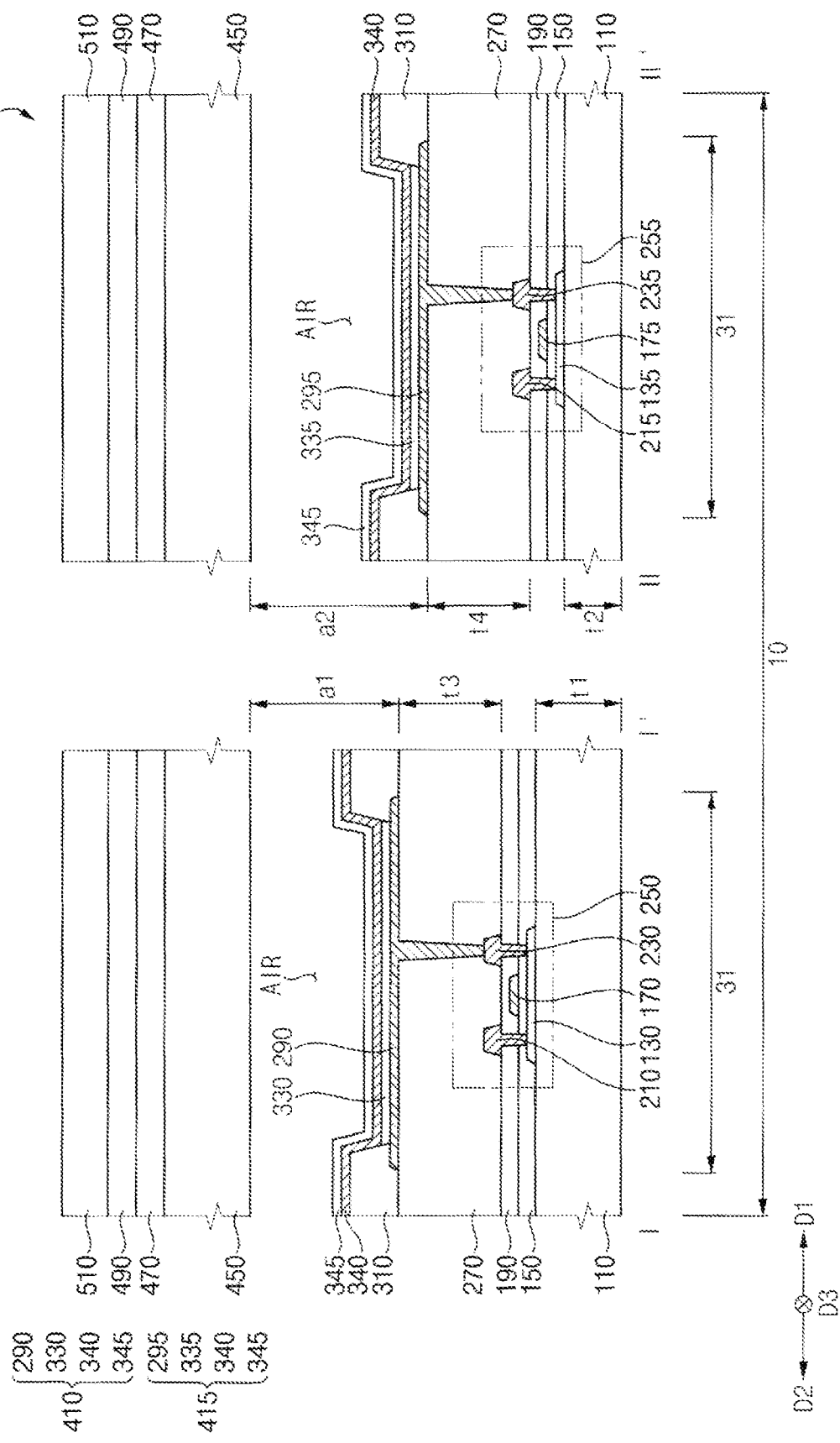
FIG. 6 is a plan view illustrating a display device according to embodiments of the inventive concepts.

FIG. 6 is a plan view illustrating a display device according to embodiments of the inventive concepts. A display device 700 shown in FIG. 6 may have a configuration that is substantially identical or similar to the display device 100 described with reference to FIGS. 1 to 5 except for a shape of a lower substrate 110. In FIG. 6, redundant descriptions of components that are substantially identical or similar to the components described with reference to FIGS. 1 to 5 will be omitted for ease in explanation of this figure.

Referring to FIGS. 2 and 6, a display device 700 may include a lower substrate 110, a first semiconductor element 250, a second semiconductor element 255, a planarization layer 270, a pixel defining layer 310, a first light emission structure 410, a second light emission structure 415, a third light emission structure 420, a fifth light emission structure 425, a fourth light emission structure 430, a sixth light emission structure 435, an upper substrate 450, a sensing structure 470, a polarizing structure 490, a cover window 510, etc. For convenience of description, a first sub-pixel region 31 in which the first light emission structure 410 is disposed is defined as a first region, and a first sub-pixel region 31 in which the second light emission structure 415 is disposed is defined as a second region.

In embodiments, the lower substrate 110 may have a first thickness t1 in the first region, and may have a second thickness t2 in the second region. Here, the first thickness t1 may be greater than the second thickness t2. For example, in a manufacturing process of the display device 700, a part of the lower substrate 110 located in the second region may be removed by performing a laser etching process, or the like in the lower substrate 110 located in the second region. That is, a thickness of the lower substrate 110 located in the second region may be reduced.

The first semiconductor element 250 may be disposed in the first region on the lower substrate 110, and the second semiconductor element 255 may be disposed in the second region on the lower substrate 110.

The planarization layer 270 may be disposed on the first semiconductor element 250 and the second semiconductor element 255. In embodiments, the planarization layer 270 may have a first thickness t3 in the first region, and may have a second thickness t4 in the second region. Here, the first thickness t3 may be a same as the second thickness t4. However, as the lower substrate 110 has the second thickness t2 in the second region, a level of an upper surface of the planarization layer 270 in the first region may be different from a level of an upper surface of the planarization layer 270 in the second region. In other words, the upper surface of the planarization layer 270 in the first region may be located to higher than the upper surface of the planarization layer 270 in the second region in a direction from the lower substrate 110 to the upper substrate 450.

A distance from an upper surface of the planarization layer 270 to a lower surface of the upper substrate 450 in the first region may be defined as a first distance a1, and a distance from the upper surface of the planarization layer 270 to the lower surface of the upper substrate 450 in the second region may be defined as a second distance a2. In embodiments, since the lower substrate 110 has the first thickness t1 in the first region and the second thickness t2 in the second region, the second distance a2 may be greater than the first distance a1.

In addition, a first contact hole exposing a part of the first semiconductor element 250 (e.g., a part of the first drain electrode 230) may be formed in the first region of the planarization layer 270, and a second contact hole exposing a part of the second semiconductor element 255 (e.g., a part of the second drain electrode 235) may be formed in the second region of the planarization layer 270. In embodiments, a first length of the first contact hole extending in a direction from an upper surface of the planarization layer 270 to a lower surface of the planarization layer 270 may be a same as a second length of the second contact hole extending in the direction.

As the display device 700 according to embodiments of the inventive concepts includes the lower substrate 110 having different thicknesses in the first region where the first light emission structure 410 is disposed and in the second region where the second light emission structure 415 is disposed, levels (i.e., positions or height) where the first and second light emission layers 330 and 335 emitting a same color of light are disposed may be differently designed. Accordingly, as the rainbow defect is improved, a display quality of the display device 700 may be relatively improved.

Figure 7:
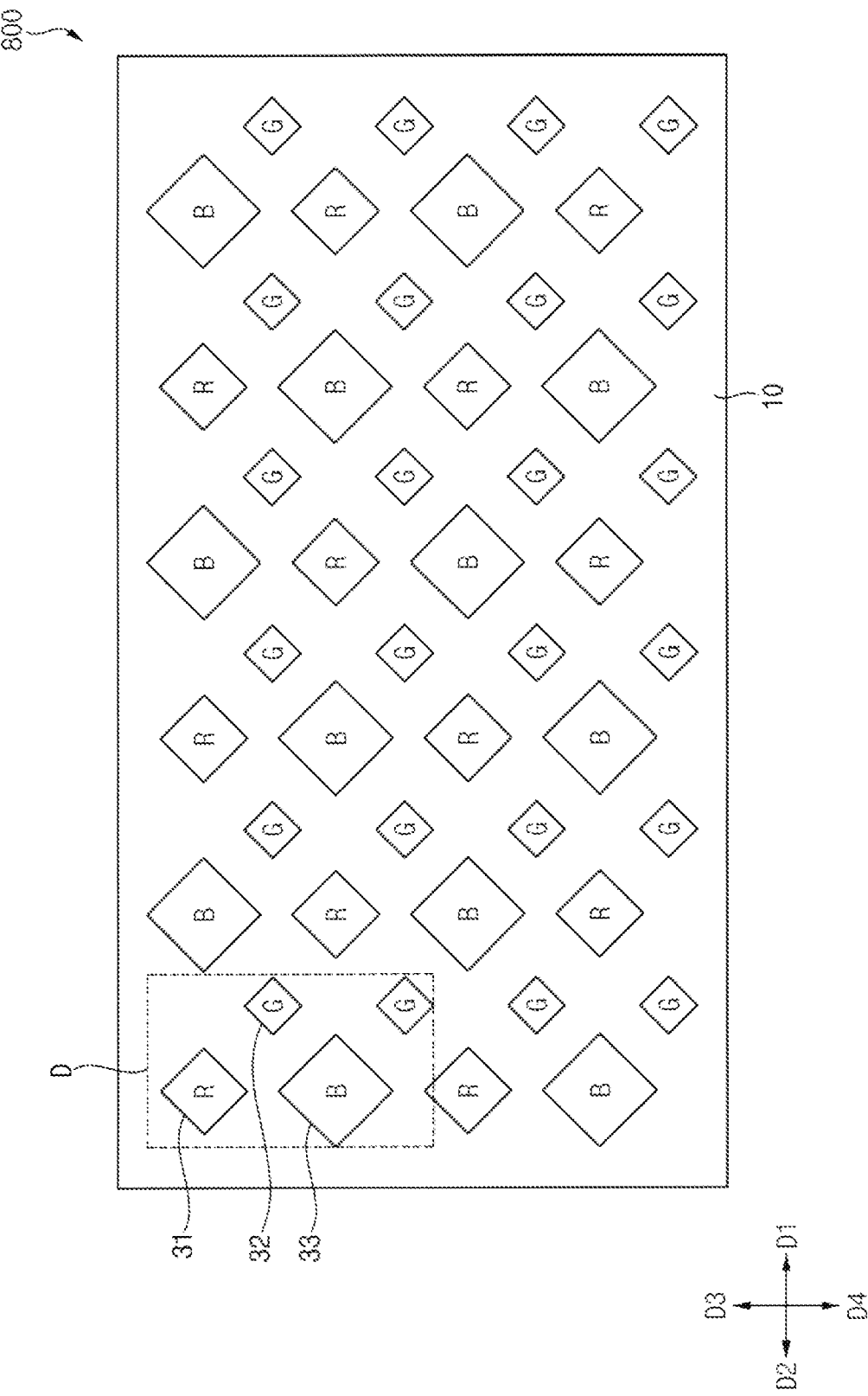
FIG. 7 is a plan view illustrating a display device according to embodiments of the inventive concepts.
Figure 8:
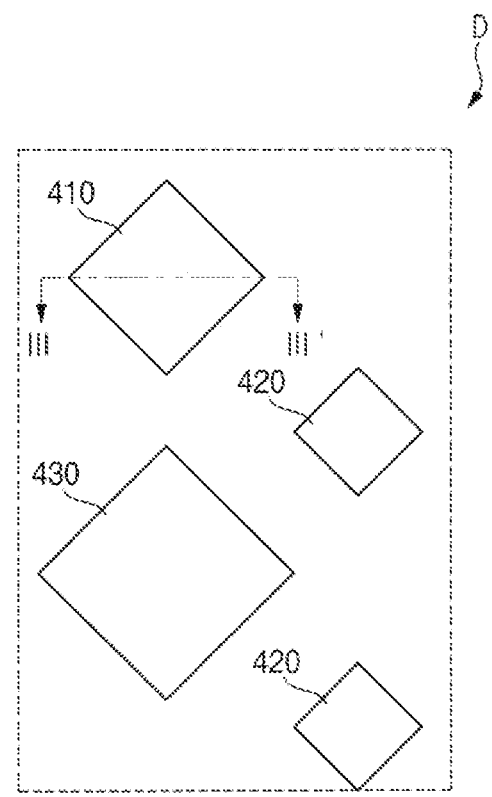
FIG. 8 is a partially enlarged plan view illustrating a region D of FIG. 7.
Figure 8:
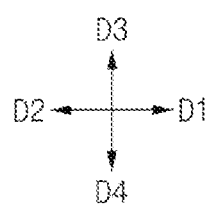
Figure 9:
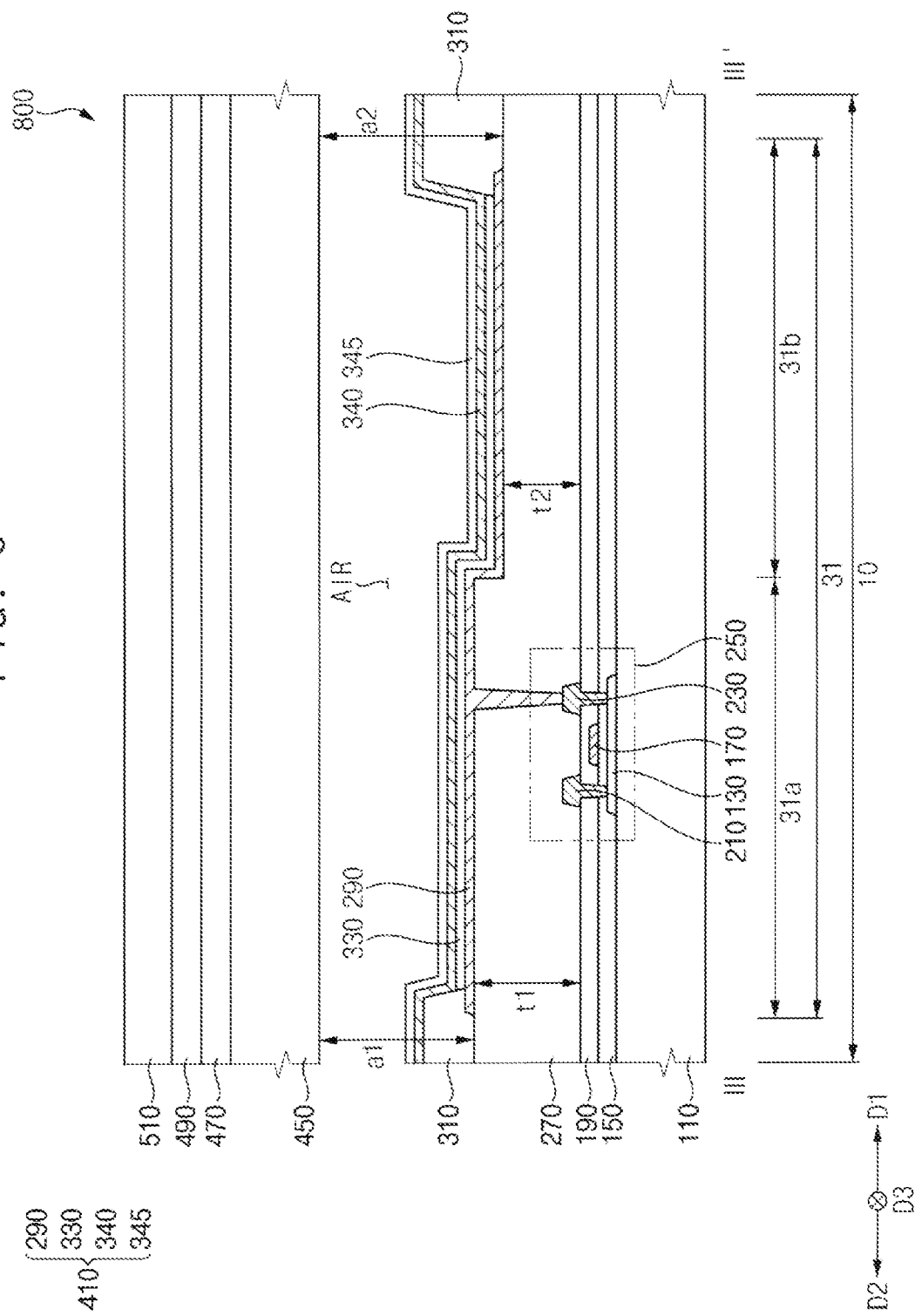
FIG. 9 is a cross-sectional view taken along a line III-III' of FIG. 7.

FIG. 7 is a plan view illustrating a display device according to embodiments of the inventive concepts, and FIG. 8 is a partially enlarged plan view illustrating a region D of FIG. 7. FIG. 9 is a cross-sectional view taken along a line III-III' of FIG. 7.

A display device 800 shown in FIGS. 7, 8, and 9 may have a configuration that is substantially identical or similar to the display device 100 described with reference to FIGS. 1 to 5 except for a shape of each of a planarization layer 270 and the first light emission structure 410. In FIGS. 7 to 9, redundant descriptions of components that are substantially identical or similar to the components described with reference to FIGS. 1 to 5 will be omitted. For example, a first pixel region and a second pixel region are illustrated in FIG. 2, and the first pixel region is only illustrated in FIG. 8.

The first pixel region may be defined as first and a third sub-pixel regions 31 and 33 located in a first column of a display region 10 and second sub-pixel regions 32 located in a second column of the display region 10. In addition, the first sub-pixel region 31 located in the first column is illustrated in FIG. 9, and the first sub-pixel region 31 may include a first region 31a and a second region 31b. The first region 31a and the second region 31b may be located adjacent to each other.

Referring to FIGS. 7, 8, and 9, a display device 800 may include a lower substrate 110, a first semiconductor element 250, a planarization layer 270, a pixel defining layer 310, a first light emission structure 410, a third light emission structure 420, a fourth light emission structure 430, an upper substrate 450, a sensing structure 470, a polarizing structure 490, a cover window 510, etc. Here, the first light emission structure 410 may include a first lower electrode 290, a first light emission layer 330, an upper electrode 340, and a capping layer 345, and the first lower electrode 290 may include a first electrode layer 291, a first reflective electrode layer 292, and a second electrode layer 293, as illustrated in FIG. 4. In addition, the first semiconductor element 250 may include a first active layer 130, a gate insulation layer 150, a first gate electrode 170, an insulating interlayer 190, a first source electrode 210, and a first drain electrode 230.

In embodiments, the planarization layer 270 may have a first thickness t1 in the first region 31a overlapping the first light emission structure 410, and may have a second thickness t2 in the second region 31b overlapping the second light emission structure 415. Here, the first thickness t1 may be greater than the second thickness t2.

The first semiconductor element 250 may be disposed in the first region 31a on the lower substrate 110 or in the second region 31b on the lower substrate 110, and the planarization layer 270 may be disposed on the first semiconductor element 250.

The planarization layer 270 may have the first thickness t1 in the first region 31a, and may have the second thickness t2 in the second region 31b. Here, the first thickness t1 may be greater than the second thickness t2. That is, the planarization layer 270 may have a step in the first sub-pixel region 31. In other words, the step of the planarization layer 270 may be formed in a boundary of the first region 31a and the second region 31b. For example, in a manufacturing process of the display device 800, the step of the planarization layer 270 may be formed by using a half tone mask. In addition, the planarization layer 270 may be continuously disposed in the first region 31a and the second region 31b.

As the planarization layer 270 has the second thickness t2 in the second region 31b, a level of an upper surface of the planarization layer 270 in the first region 31a may be different from a level of an upper surface of the planarization layer 270 in the second region 31b. In other words, the upper surface of the planarization layer 270 in the first region 31a may be located to higher than the upper surface of the planarization layer 270 in the second region 31b in a direction from the lower substrate 110 to the upper substrate 450.

A distance from an upper surface of the planarization layer 270 to a lower surface of the upper substrate 450 in the first region 31a may be defined as a first distance a1, and a distance from the upper surface of the planarization layer 270 to the lower surface of the upper substrate 450 in the second region 31b may be defined as a second distance a2. In embodiments, since the planarization layer 270 has the first thickness t1 in the first region 31a and the second thickness t2 in the second region 31b, the second distance a2 may be greater than the first distance a1.

The first lower electrode 290 may be disposed in the first and second regions 31a and 31b on the planarization layer 270. In embodiments, the first lower electrode 290 may have a same thickness in the first and second regions 31a and 31b, and may be continuously disposed in the first and second regions 31a and 31b. In addition, a step of the first lower electrode 290 may be formed in a boundary of the first and second regions 31a and 31b by the step of the planarization layer 270.

The pixel defining layer 310 may be disposed on a part of the first lower electrode 290 and the planarization layer 270. The pixel defining layer 310 may cover both lateral portions of the first lower electrode 290. For example, the pixel defining layer 310 may surround a periphery of the first and second regions 31a and 31b.

The first light emission layer 330 may be disposed on the first lower electrode 290. In embodiments, the first light emission layer 330 may have a same thickness in the first and second regions 31a and 31b, and may be continuously disposed in the first and second regions 31a and 31b. In addition, a step of the first light emission layer 330 may be formed in a boundary of the first and second regions 31a and 31b by the step of the planarization layer 270.

The upper electrode 340 may be disposed on the pixel defining layer 310 and the first light emission layer 330. In embodiments, the upper electrode 340 may have a same thickness in the first and second regions 31a and 31b, and may be continuously disposed in the first and second regions 31a and 31b. In addition, a step of the upper electrode 340 may be formed in a boundary of the first and second regions 31a and 31b by the step of the planarization layer 270.

The capping layer 345 may be disposed on the upper electrode 340. In embodiments, the capping layer 345 may have a same thickness in the first and second regions 31a and 31b, and may be continuously disposed in the first and second regions 31a and 31b. In addition, a step of the capping layer 345 may be formed in a boundary of the first and second regions 31a and 31b by the step of the planarization layer 270.

As the display device 800 according to embodiments of the inventive concepts includes the planarization layer 270 having different thicknesses in the first and second regions 31a and 31b where the first light emission structure 410 is disposed, a height of the first light emission layer 330 may be differently designed in the first and second regions 31a and 31b. Accordingly, as the rainbow defect is improved, a display quality of the display device 800 may be relatively improved.

The embodiments according to the inventive concepts described herein may be applied to various electronic devices including a display device. For example, the embodiments according to the inventive concepts may be applied to numerous electronic devices such as vehicle-display devices, ship-display devices, aircraft-display devices, portable communication devices, exhibition display devices, information transfer display devices, medical-display devices, etc.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a lower substrate including a first region and a second region;
a planarization layer disposed on the lower substrate, the planarization layer having a first thickness in the first region and a second thickness, which is less than the first thickness, in the second region;
a first light emission structure provided in the first region and arranged on the planarization layer, the first light emission structure emitting a first color of light;
a second light emission structure provided in the second region and arranged on the planarization layer, the second light emission structure emitting the first color of light; and
an upper substrate disposed on the first and second light emission structures and having a lower surface that is entirely flat,
wherein:
a first air gap is formed between the first light emission structure and the upper substrate, and a second air gap is formed between the second light emission structure and the upper substrate,
a thickness of the first air gap is less than a thickness of the second air gap,
the planarization layer has a flat upper surface throughout ones of the first region and the second region, and
only a single sub-pixel is disposed between the first region and the second region.

2. The display device of claim 1, wherein the first light emission structure includes a first lower electrode and a first light emission layer disposed on the first lower electrode, and the second light emission structure includes a second lower electrode and a second light emission layer disposed on the second lower electrode.

3. The display device of claim 2, wherein a first distance from the lower surface of the upper substrate to an upper surface of the planarization layer located in the first region is less than a second distance from the lower surface of the upper substrate to the upper surface of the planarization layer located in the second region.

4. The display device of claim 3, wherein
a difference between the second distance and the first distance is equal to about 0.1 micrometers or less, and the planarization layer is comprised of an organic insulating material.

5. The display device of claim 1, further comprising:
a first semiconductor element disposed in the first region on the lower substrate; and
a second semiconductor element disposed in the second region on the lower substrate,
wherein the planarization layer covers the first and second semiconductor elements.

6. The display device of claim 5, wherein the planarization layer includes:
a first contact hole located in the first region, the first contact hole exposing a part of the first semiconductor element; and
a second contact hole located in the second region, the second contact hole exposing a part of the second semiconductor element, and
wherein a first length of the first contact hole extending in a direction from the an upper surface of the planarization layer to the lower surface of the planarization layer is greater than a second length of the second contact hole extending in the direction.

7. The display device of claim 1, further comprising:
a third light emission structure disposed adjacent to the first light emission structure, the third light emission structure emitting a second color of light; and
a fourth light emission structure disposed adjacent to the first and third light emission structures, the fourth light emission structure emitting a third color of light.

8. The display device of claim 7, further comprising:
a fifth light emission structure disposed adjacent to the second light emission structure, the fifth light emission structure emitting the second color of light; and
a sixth light emission structure disposed adjacent to the second and fifth light emission structures, the sixth light emission structure emitting the third color of light,
wherein the planarization layer on which the third and fourth light emission structures are disposed has the first thickness, and the planarization layer on which the fifth and sixth light emission structures are disposed has the second thickness.

9. A display device comprising:
a lower substrate including a first region and a second region located adjacent to the first region;
a planarization layer disposed on the lower substrate, the planarization layer having a first thickness in the first region and a second thickness, which is less than the first thickness, in the second region;
a light emission structure provided in the first and second regions and arranged on the planarization layer, the light emission structure emitting a first color of light;
semiconductor elements disposed in the first region on the lower substrate; and
an upper substrate disposed on the light emission structure and having a lower surface that is entirely flat,
wherein:
a first distance from the lower surface of the upper substrate to an upper surface of the planarization layer located in the first region is less than a second distance from the lower surface of the upper substrate to the upper surface of the planarization layer located in the second region,
an air gap is formed between the light emission structure and the upper substrate, a thickness of the air gap in the first region is less than a thickness of the air gap in the second region, and the planarization layer has a flat upper surface throughout ones of the first region and the second region.

10. The display device of claim 9, wherein the planarization layer and the light emission structure includes a step in a boundary of the first and second regions.

11. The display device of claim 9, wherein the planarization layer is located in the first region or the second region, and includes a contact hole exposing a part of the semiconductor element, and wherein the light emission structure is electrically connected to the semiconductor element through the contact hole.

12. The display device of claim 9, wherein the light emission structure is continuously disposed in the first and second regions.

13. The display device of claim 1, further comprising a pixel defining layer disposed around each of the first light emission structure in the first region and the second light emission structure in the second region, wherein a maximum thickness of the pixel defining layer in a vicinity of the first light emission structure is equal to a maximum thickness of the pixel defining layer in a vicinity of the second light emission structure.

\* \* \* \* \*